(12) United States Patent
Makishi

(10) Patent No.: US 10,777,110 B2
(45) Date of Patent: Sep. 15, 2020

(54) DISPLAY DEVICE AND MANUFACTURING METHOD THEREFOR, AND MULTI-PIECE DISPLAY PANEL

(71) Applicant: Japan Display Inc., Minato-ku (JP)

(72) Inventor: Kota Makishi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/750,310

(22) Filed: Jan. 23, 2020

(65) Prior Publication Data
US 2020/0243789 A1 Jul. 30, 2020

(30) Foreign Application Priority Data

Jan. 25, 2019 (JP) .................................. 2019-011075

(51) Int. Cl.
| | |
|---|---|
| G09G 3/00 | (2006.01) |
| H01L 51/50 | (2006.01) |
| H01L 51/56 | (2006.01) |
| H01L 27/32 | (2006.01) |
| G09G 3/3208 | (2016.01) |
| G09G 3/12 | (2006.01) |
| G09G 3/30 | (2006.01) |

(52) U.S. Cl.
CPC ............... *G09G 3/006* (2013.01); *G09G 3/12* (2013.01); *G09G 3/30* (2013.01); *G09G 3/3208* (2013.01); *H01L 27/3244* (2013.01); *H01L 51/5056* (2013.01); *H01L 51/56* (2013.01); *G03G 2215/0412* (2013.01); *G03G 2215/0456* (2013.01)

(58) Field of Classification Search
CPC ............ G09G 3/006; G09G 3/12; G09G 3/30; G09G 3/3208; H01L 51/5056; H01L 27/3244; H01L 51/56; G03G 2215/0412; G03G 2215/0456
See application file for complete search history.

(56) References Cited

U.S. PATENT DOCUMENTS

| | | | |
|---|---|---|---|
| 10,497,905 B2 * | 12/2019 | Yoshida ................. | G09F 9/30 |
| 2004/0097160 A1 | 5/2004 | Kaltenbach et al. | |
| 2011/0080173 A1 * | 4/2011 | Kim ..................... | G09G 3/006 |
| | | | 324/403 |
| 2012/0169346 A1 * | 7/2012 | Huang .................. | G09G 3/006 |
| | | | 324/414 |

(Continued)

FOREIGN PATENT DOCUMENTS

| | | |
|---|---|---|
| JP | 2004-172127 A | 6/2004 |
| JP | 2018-077982 A | 5/2018 |

*Primary Examiner* — John P. Dulka
(74) *Attorney, Agent, or Firm* — Oblon, McClelland, Maier & Neustadt, L.L.P.

(57) ABSTRACT

A weak light releasing layer includes a plurality of weak light releasing sections separated from each other by overlapping with corresponding one of the plurality of light releasing sections and a second inspection portion that is positioned relatively to the plurality of weak light releasing sections and overlaps with a first inspection portion. There are a first region and a second region that differ depending on whether or not there is an overlap with the second inspection portion inside an outer shape of the first inspection portion. The first region is sandwiched between any pair of portions of the second region in any of a plurality of directions orthogonal to each other.

20 Claims, 15 Drawing Sheets

(56) References Cited

U.S. PATENT DOCUMENTS

| | | | |
|---|---|---|---|
| 2015/0145549 A1* | 5/2015 | Wen | G02F 1/13306 |
| | | | 324/760.01 |
| 2016/0379907 A1* | 12/2016 | Ko | H01L 27/1237 |
| | | | 257/48 |
| 2018/0019441 A1* | 1/2018 | Noh | H01L 51/5256 |
| 2018/0061722 A1* | 3/2018 | Byun | H01L 51/0031 |
| 2018/0076102 A1* | 3/2018 | Ka | H01L 29/41733 |
| 2018/0130971 A1 | 5/2018 | Asozu et al. | |
| 2018/0151850 A1* | 5/2018 | Lee | H01L 27/3206 |
| 2018/0374914 A1* | 12/2018 | Maeda | G09G 3/006 |
| 2019/0035315 A1* | 1/2019 | Ai | H01L 51/56 |
| 2019/0088909 A1* | 3/2019 | Cheon | G09G 3/00 |
| 2019/0097162 A1* | 3/2019 | Wang | H01L 27/3246 |
| 2020/0066195 A1* | 2/2020 | Li | H01L 51/0031 |

\* cited by examiner

DISPLAY DEVICE AND MANUFACTURING METHOD THEREFOR, AND MULTI-PIECE DISPLAY PANEL

CROSS-REFERENCE TO RELATED APPLICATION

The present application claims priority from Japanese patent application JP 2019-011075 filed on Jan. 25, 2019, the content of which is hereby incorporated by reference into this application.

BACKGROUND OF THE INVENTION

1. Field of the Invention

The present invention relates to a display device, a manufacturing method therefor, and a multi-piece display panel.

2. Description of the Related Art

An organic electroluminescence display device is known in which a light emitting layer is separated for each light emitting color so that a pixel is composed of red, green, and blue (RGB) subpixels (JP 2018-077982 A). The positional deviation of the separated light emitting layer is inspected by using a phenomenon (photoluminescence) in which light is emitted by irradiation with ultraviolet rays (JP 2004-172127 A). For example, a test element group (TEG) of the light emitting layer is formed outside a display area, and inspection is performed by using photoluminescence. Further, since a hole transport layer is also separated for each light emitting color, the inspection of the position thereof is necessary.

Since the hole transport layer is weak in light emission by photoluminescence, the position of the hole transport layer cannot be visually recognized by the TEG alone of the hole transport layer. On the other hand, when the TEG of the light emitting layer and the TEG of the hole transport layer are overlapped, the boundary line between the two can be recognized by the difference in luminance, but the two-dimensional shape is difficult to recognize. Therefore, the inspection accuracy is lowered.

SUMMARY OF THE INVENTION

An object of the present invention is to enable positional deviation inspection with high accuracy.

A display device according to the present invention includes an electrode layer that includes a plurality of pixel electrodes arranged in a display area, and a visual recognition electrode positioned relatively to the plurality of pixel electrodes outside the display area, a plurality of layers that include a light emitting layer overlapping with the electrode layer and emitting light by electroluminescence, a lowermost layer being in contact with the plurality of pixel electrodes in the display area, and a common electrode that faces the plurality of pixel electrodes and is in contact with any of the plurality of layers, in which the plurality of layers include a light releasing layer that emits light by photoluminescence, and a weak light releasing layer that emits less light by the photoluminescence than the light releasing layer, at least the light emitting layer is the light releasing layer, the light releasing layer includes a plurality of light releasing sections that are separated from each other, and a first inspection portion that is positioned relatively to the plurality of light releasing sections and overlaps with the visual recognition electrode, the weak light releasing layer includes a plurality of weak light releasing sections separated from each other by overlapping with corresponding one of the plurality of light releasing sections and a second inspection portion that is positioned relatively to the plurality of weak light releasing sections and overlaps with the first inspection portion, there are a first region and a second region that differ depending on whether or not there is an overlap with the second inspection portion inside an outer shape of the first inspection portion, and the first region is sandwiched between any pair of portions of the second region in any of a plurality of directions orthogonal to each other.

According to the present invention, it is possible to perform positional deviation inspection with high accuracy by using the first region and the second region having different degrees of light emission by photoluminescence.

A multi-piece display panel according to the present invention is a multi-piece display panel having a plurality of manufacturing areas for manufacturing a plurality of display devices, in which each of the plurality of manufacturing areas includes an electrode layer that includes a plurality of pixel electrodes arranged in a display area, and a visual recognition electrode positioned relatively to the plurality of pixel electrodes outside the display area, a plurality of layers that include a light emitting layer overlapping with the electrode layer and emitting light by electroluminescence, a lowermost layer being in contact with the plurality of pixel electrodes in the display area, and a common electrode that faces the plurality of pixel electrodes and is in contact with any of the plurality of layers, in which the plurality of layers include a light releasing layer that emits light by photoluminescence, and a weak light releasing layer that emits less light by the photoluminescence than the light releasing layer, at least the light emitting layer is the light releasing layer, the light releasing layer includes a plurality of light releasing sections that are separated from each other, and a first inspection portion that is positioned relatively to the plurality of light releasing sections and overlaps with the visual recognition electrode, the weak light releasing layer includes a plurality of weak light releasing sections separated from each other by overlapping with corresponding one of the plurality of light releasing sections, and a second inspection portion that is positioned relatively to the plurality of weak light releasing sections and overlaps with the first inspection portion, there are a first region and a second region that differ depending on whether or not there is an overlap with the second inspection portion inside an outer shape of the first inspection portion, and the first region is sandwiched between any pair of portions of the second region in any of a plurality of directions orthogonal to each other.

According to the present invention, it is possible to perform positional deviation inspection with high accuracy by using the first region and the second region having different degrees of light emission by photoluminescence.

A manufacturing method for a display device according to the present invention includes forming an electrode layer so as to include a plurality of pixel electrodes arranged in a display area, and a visual recognition electrode positioned relatively to the plurality of pixel electrodes outside the display area, forming a plurality of layers so as to include a light emitting layer overlapping with the electrode layer and emitting light by electroluminescence, a lowermost layer being in contact with the plurality of pixel electrodes in the display area, and forming a common electrode so as to face the plurality of pixel electrodes and to be in contact with any one of the plurality of layers, and positional deviation inspection, in which the plurality of layers include a light releasing layer that emits light by photoluminescence, and a weak light releasing layer that emits less light by the photoluminescence than the light releasing layer, at least the light emitting layer is the light releasing layer, the light releasing layer includes a plurality of light releasing sections that are separated from each other, and a first inspection portion that is positioned relatively to the plurality of light releasing sections and overlaps with the visual recognition electrode, the weak light releasing layer includes a plurality of weak light releasing sections separated from each other by overlapping with corresponding one of the plurality of light releasing sections, and a second inspection portion that is positioned relatively to the plurality of weak light releasing sections and overlaps with the first inspection portion, there are a first region and a second region that differ depending on whether or not there is an overlap with the second inspection portion inside an outer shape of the first inspection portion, and the first region is sandwiched between any pair of portions of the second region in any of a plurality of directions orthogonal to each other, and the positional deviation inspection includes recognizing the visual recognition electrode by reflected light, recognizing the first inspection portion and the second inspection portion by an intensity of light emission by the photoluminescence being different in the first region and the second region, and determining a positional deviation of the light releasing layer and the weak light releasing layer according to a relative position of the visual electrode and the first inspection portion and the second inspection portion.

According to the present invention, it is possible to perform positional deviation inspection with high accuracy by using the first region and the second region having different degrees of light emission by photoluminescence.

DETAILED DESCRIPTION OF THE INVENTION

Figure 1:
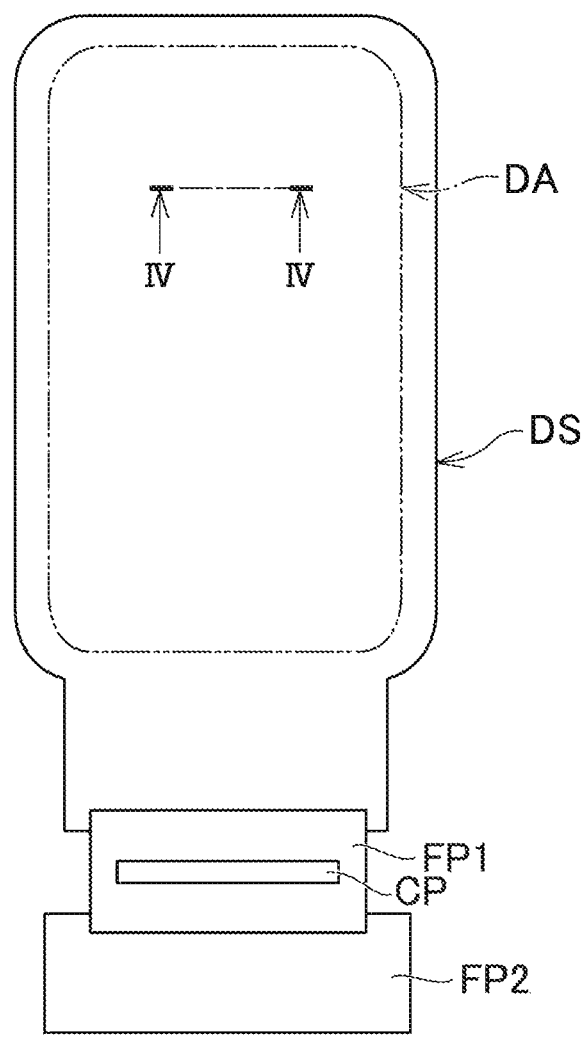
FIG. 1 is a plan view of a display device according to an embodiment.

Embodiments of the present invention will be described below with reference to drawings. However, the present invention can be implemented in various modes without departing from the gist thereof and is not construed as being limited to the description of the embodiments described below.

In order to make the description clearer, the drawings may be schematically represented with respect to the width, thickness, shape, and the like of each part as compared to an actual mode, but are merely examples and do not limit the interpretation of the present invention. In the present specification and each drawing, elements having the same functions as those described with reference to the previous drawings may be denoted by the same reference numerals and redundant description may be omitted.

Further, in the detailed description of the present invention, when defining the positional relationship between a certain component and another component, "upper" and "below" include not only the case of being positioned immediately above or immediately below a certain component, but also the case of interposing another component in between, unless otherwise specified.

Figure 2:
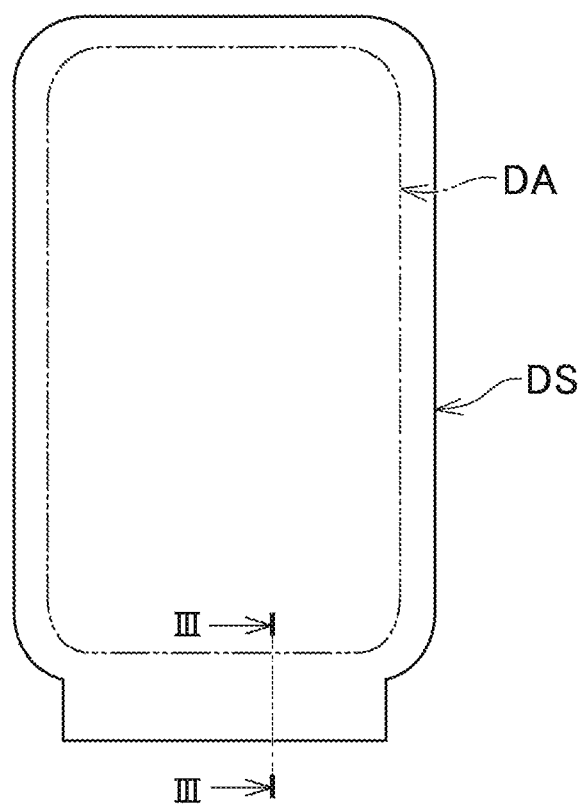
FIG. 2 is a schematic view showing a usage state of the display device.
Figure 3:
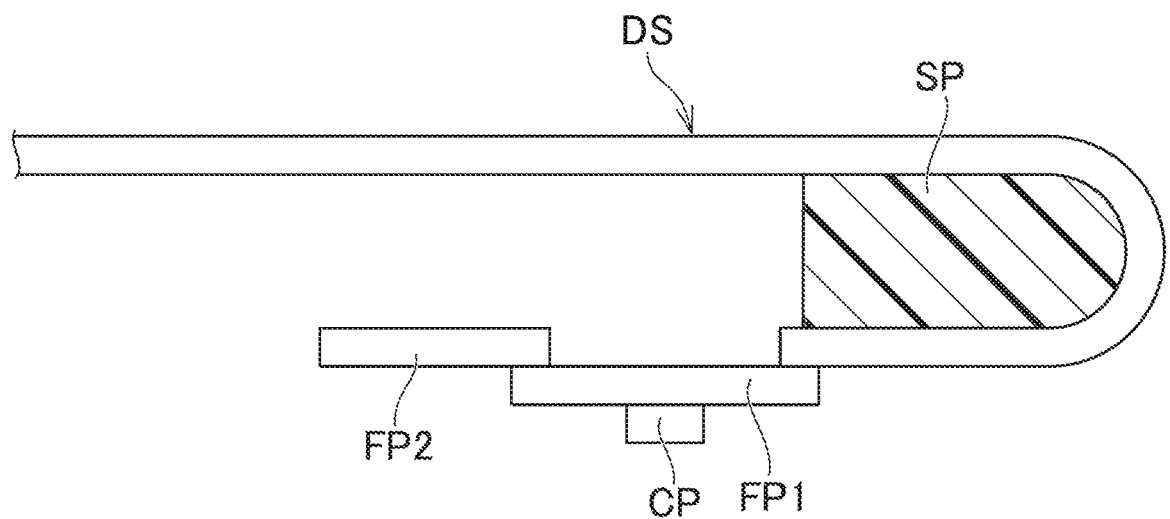
FIG. 3 is a schematic view of a cross section taken along the line III-III of the display device shown in FIG. 2.

FIG. 1 is a plan view of a display device according to an embodiment. Actually, the display device is used after being bent. Therefore, FIG. 1 is a development view before the display device is bent. FIG. 2 is a schematic view showing a usage state of the display device. FIG. 3 is a schematic view of a cross section taken along the line III-III of the display device shown in FIG. 2. The display device includes a display DS. A spacer SP is disposed inside a bend to prevent the display DS from being bent excessively. The display DS has flexibility and is bent outside a display area DA. A first flexible printed substrate FP1 is connected to the display DS outside the display area DA. An integrated circuit chip CP for driving an element for displaying an image is mounted on the first flexible printed substrate FP1. Further, a second flexible printed substrate FP2 is connected to the first flexible printed substrate FP1.

The display device is, for example, an organic electroluminescent display device. The display device has the display area DA in which an image is displayed. In the display area DA, for example, a full-color pixel is formed by combining a plurality of color unit pixels (sub-pixels) composed of red, green, and blue, and a full-color image is displayed.

Figure 4:
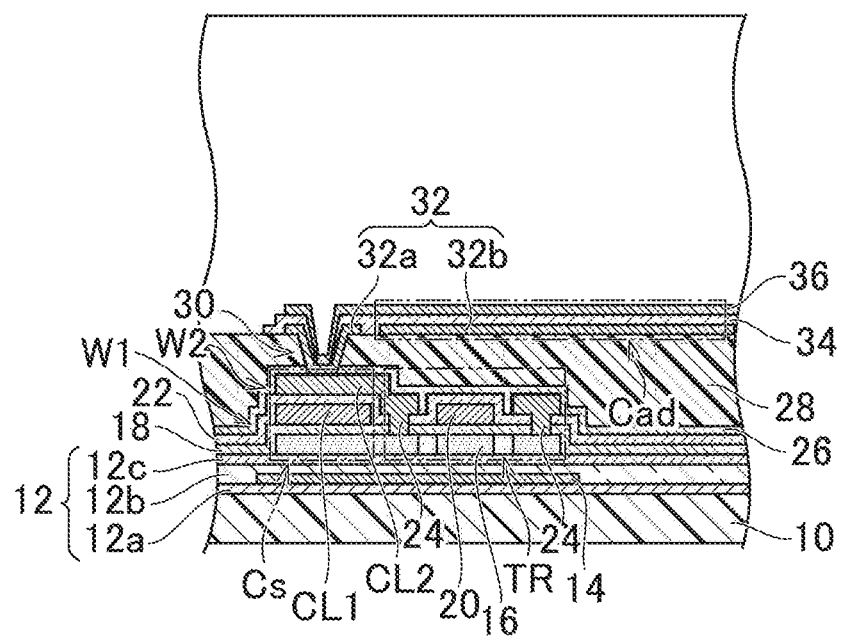
FIG. 4 is a cross-sectional view taken along the line IV-IV of the display device shown in FIG. 1.

FIG. 4 is a cross-sectional view taken along the line IV-IV of the display device shown in FIG. 1. A substrate 10 is made of polyimide. However, other resin materials may be used as long as a base material has sufficient flexibility to constitute a sheet display or a flexible display.

A barrier inorganic film 12 (undercoat layer) is laminated on the substrate 10. The barrier inorganic film 12 has a three-layer laminated structure of a silicon oxide film 12a, a silicon nitride film 12b, and a silicon oxide film 12c. The lowermost silicon oxide film 12a is provided to improve adhesion to the substrate 10, the middle silicon nitride film 12b is provided as a film that blocks moisture and impurities from the outside, and the uppermost silicon oxide film 12c is provided as a block film that prevents hydrogen atoms contained in the silicon nitride film 12b from diffusing to a semiconductor layer 16 side of a thin film transistor TR, but in particular, the structure is not limited thereto, and there may be a further lamination including a single layer or a two-layer lamination.

A functional film 14 may be formed in accordance with the location where the thin film transistor TR is formed. The functional film 14 can give a back gate effect to the thin film transistor TR by suppressing changes in the characteristics of the thin film transistor TR due to intrusion of light from the back surface of the channel or by being formed of a conductive material and given a predetermined potential. Here, the functional film 14 is enclosed in the barrier inorganic film 12 after forming the silicon oxide film 12a, forming the functional film 14 in an island shape in accordance with the location where the thin film transistor TR is formed, and then laminating the silicon nitride film 12b and the silicon oxide film 12c, but the functional film 14 may be first formed on the substrate 10 and then the barrier inorganic film 12 may be formed.

The thin film transistor TR is formed on the barrier inorganic film 12. Taking a polysilicon thin film transistor as an example, only an Nch transistor is shown here, but a Pch transistor may be formed simultaneously. The semiconductor layer 16 of the thin film transistor TR has a structure in which a low concentration impurity region is provided between a channel region and a source/drain region. Here, a silicon oxide film is used as a gate insulating film 18. A gate electrode 20 is a part of a first wiring layer W1 formed from MoW. The first wiring layer W1 has a first storage capacitor line CL1 in addition to the gate electrode 20. A part of a storage capacitor Cs is formed between the first storage capacitor line CL1 and the semiconductor layer 16 (source/drain region) via the gate insulating film 18.

An interlayer insulating film 22 (silicon oxide film and silicon nitride film) is laminated on the gate electrode 20. On the interlayer insulating film 22, a second wiring layer W2 including a portion to be a source/drain electrode 24 is formed. Here, a three-layer laminated structure of Ti, Al, and Ti is adopted. Another part of the storage capacitor Cs is formed by the first storage capacitor line CL1 (part of the first wiring layer W1) and a second storage capacitor line CL2 (part of the second wiring layer W2) via the interlayer insulating film 22.

A passivation film 26 is formed on the interlayer insulating film 22 so as to cover the second wiring layer W2 (source/drain electrode 24). A planarizing film 28 is provided on the passivation film 26. The planarizing film 28 is made of a resin such as photosensitive acrylic having excellent surface flatness compared to an inorganic insulating material formed by chemical vapor deposition (CVD) or the like.

The planarizing film 28 and the passivation film 26 are removed in a pixel contact portion 30, and an indium tin oxide (ITO) film 32 is formed thereon. The indium tin oxide film 32 includes a first transparent conductive film 32a and a second transparent conductive film 32b that are separated from each other. The second wiring layer W2 whose surface is exposed by the removal of the planarizing film 28 and the passivation film 26 is covered with the first transparent conductive film 32a. A silicon nitride film 34 is provided on the planarizing film 28 so as to cover the first transparent conductive film 32a. The silicon nitride film 34 has an opening in the pixel contact portion 30, and a pixel electrode 36 is laminated so as to be electrically connected to the source/drain electrode 24 through the opening. The pixel electrode 36 is formed as a reflective electrode and has a three-layer laminated structure of an indium zinc oxide film, an Ag film, and an indium zinc oxide film. Here, an indium tin oxide film may be used instead of the indium zinc oxide film. The pixel electrode 36 extends laterally from the pixel contact portion 30 and reaches above the thin film transistor TR.

The second transparent conductive film 32b is provided adjacent to the pixel contact portion 30 and below the pixel electrode 36 (further below the silicon nitride film 34). The second transparent conductive film 32b, the silicon nitride film 34, and the pixel electrode 36 overlap with each other, thereby forming an additional capacitor Cad.

Figure 5:
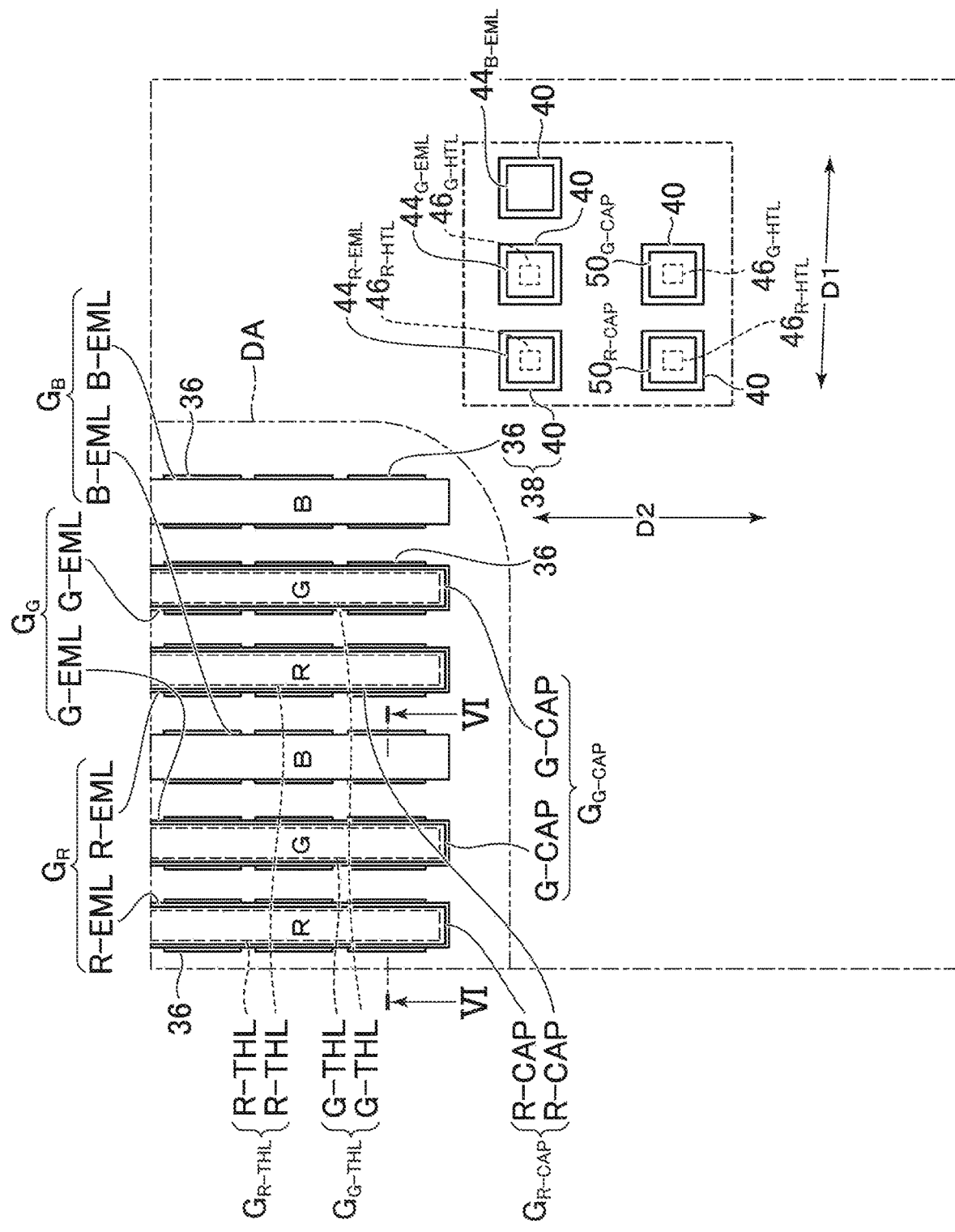
FIG. 5 is an enlarged plan view of a part of the display device shown in FIG. 1.

FIG. 5 is an enlarged plan view of a part of the display device shown in FIG. 1. A plurality of pixel electrodes 36 arranged in the display area DA are part of an electrode layer 38. The electrode layer 38 includes a plurality of visual recognition electrodes 40. The visual recognition electrode 40 is positioned relatively to the plurality of pixel electrodes 36 outside the display area DA.

Figure 6:
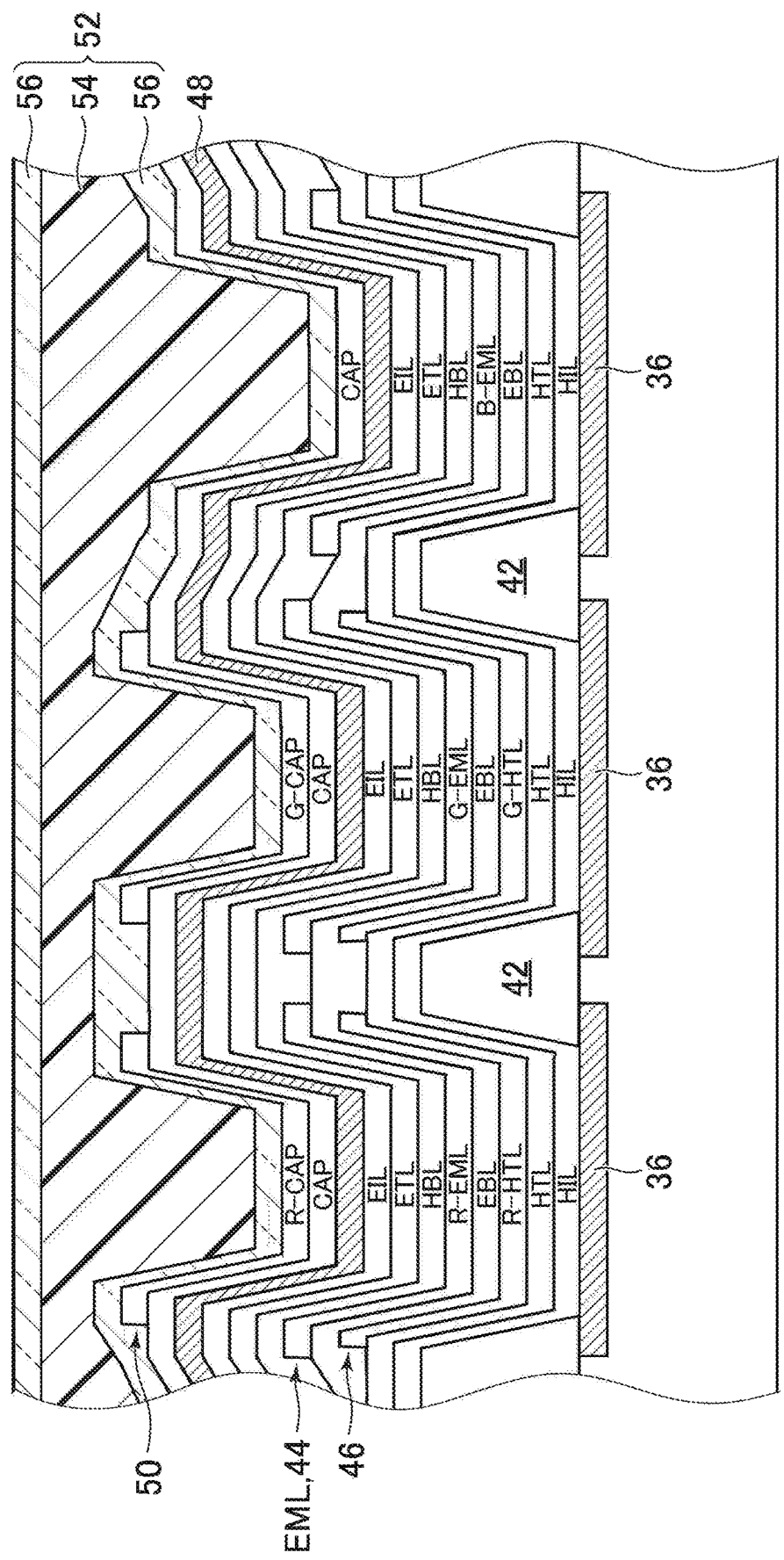
FIG. 6 is a cross-sectional view taken along the line VI-VI of the display device shown in FIG. 5.

FIG. 6 is a cross-sectional view taken along the line VI-VI of the display device shown in FIG. 5. On the planarizing film 28 (FIG. 4), an insulating layer 42 called a bank (rib), which becomes a partition wall between adjacent pixel regions, is formed. As the insulating layer 42, photosensitive acrylic or the like is used as in the planarizing film 28. The insulating layer 42 has a plurality of openings so that the surfaces of the plurality of pixel electrodes 36 are exposed as light emitting regions. The plurality of openings overlap with the central portions of the plurality of pixel electrodes 36, respectively. The insulating layer 42 is placed on the peripheral end portion of each pixel electrode 36. It is preferable that the opening end has a gentle taper shape. If the opening end has a steep shape, an electroluminescent layer formed thereon has poor coverage.

A plurality of layers overlap with the electrode layer 38. A lowermost layer HIL (for example, hole injection layer) is in continuous contact with the plurality of pixel electrodes 36 in the display area DA, for example. The lowermost layer HIL is in contact with the pixel electrode 36 through the opening of the insulating layer 42. The lowermost layer HIL is placed at the central portion of each pixel electrode 36. The insulating layer 42 is interposed between the peripheral edge of each pixel electrode 36 and the lowermost layer HIL. The lowermost layer HIL is placed on the insulating layer 42.

[Light Releasing Layer (Light Emitting Layer)]

The plurality of layers overlapping with the electrode layer 38 include a light emitting layer EML that emits light by electroluminescence. The light emitting layer EML includes a plurality of light emitting sections R-EML, G-EML, and B-EML separated from each other. The plurality of light emitting sections R-EML, G-EML, and B-EML are divided into a plurality of color groups $G_R$, $G_G$, and $G_B$ by a plurality of light emitting colors (for example, red, green, and blue) (FIG. 5). The color group $G_R$ includes the light emitting section R-EML. The color group $G_G$ includes the light emitting section G-EML. The color group $G_B$ includes the light emitting section B-EML.

The light emitting layer EML is also a light releasing layer 44 that emits light by photoluminescence. Photoluminescence is a phenomenon in which light is emitted by irradiation with light having high energy such as ultraviolet rays. The light releasing layer 44 includes a plurality of light releasing sections R-EML, G-EML, and B-EML as the plurality of light emitting sections R-EML, G-EML, and B-EML. The light releasing layer 44 includes a plurality of first inspection portions $44_{R-EML}$, $44_{G-EML}$, and $44_{B-EML}$ that overlap with the plurality of visual recognition electrodes 40.

The first inspection portion $44_{R\text{-}EML}$ is positioned relatively to the plurality of light releasing sections R-EML. A first inspection portion $44_{G\text{-}EML}$ is positioned relatively to the plurality of light releasing sections G-EML. The first inspection portion $44_{B\text{-}EML}$ is positioned relatively to the plurality of light releasing sections B-EML. Each of the plurality of first inspection portions $44_{R\text{-}EML}$, $44_{G\text{-}EML}$, and $44_{B\text{-}EML}$ overlaps with a corresponding one of the plurality of visual recognition electrodes 40.

[Weak Light Releasing Layer]

The plurality of layers overlapping with the electrode layer 38 include a weak light releasing layer 46 that emits less light by photoluminescence than the light releasing layer 44. The weak light releasing layer 46 is a carrier transport layer (for example, a hole transport layer) for transporting charges.

The weak light releasing layer 46 includes a plurality of weak light releasing sections R-THL that overlap the plurality of light releasing sections R-EML respectively and are separated from each other. The weak light releasing layer 46 includes a plurality of weak light releasing sections G-HTL that overlap the plurality of light releasing sections G-EML respectively and are separated from each other.

The plurality of weak light releasing sections R-THL and G-HTL are divided into a plurality of weak light releasing groups $G_{R\text{-}THL}$ and $G_{G\text{-}THL}$ respectively corresponding to the plurality of color groups $G_R$ and $G_G$ except for one (FIG. 5). The weak light releasing group $G_{R\text{-}THL}$ includes the weak light releasing section R-THL. The weak light releasing group $G_{G\text{-}THL}$ includes the weak light releasing section G-HTL.

The weak light releasing layer 46 includes a plurality of second inspection portions $46_{R\text{-}HTL}$ and $46_{G\text{-}HTL}$ (FIG. 5). The second inspection portion $46_{R\text{-}HTL}$ is positioned relatively to the weak light releasing section R-THL. The second inspection portion $46_{G\text{-}HTL}$ is positioned relatively to the weak light releasing section G-HTL. The second inspection portion $46_{R\text{-}HTL}$ overlaps with the first inspection portion $44_{R\text{-}EML}$. The second inspection portion $46_{G\text{-}HTL}$ overlaps with the first inspection portion $44_{G\text{-}EML}$. The second inspection portions $46_{R\text{-}HTL}$ and $46_{G\text{-}HTL}$ are similar to the first inspection portions $44_{R\text{-}EML}$ and $44_{G\text{-}EML}$ in a planar shape.

[Weak Light Releasing Continuous Layer]

For example, a weak light releasing continuous layer HTL continuously overlaps with the weak light releasing layer 46 (the plurality of weak light releasing sections R-THL and G-HTL). The weak light releasing continuous layer HTL is formed of the same material as the weak light releasing layer 46 (the plurality of weak light releasing sections R-THL and G-HTL). That is, the weak light releasing continuous layer HTL is also a carrier transport layer (for example, a hole transport layer) for transporting charges. The plurality of weak light releasing sections R-THL and G-HTL are formed to increase the thickness of the carrier transport layer. That is, the thickness of the carrier transport layer is different according to each of the plurality of color groups $G_R$, $G_G$, and $G_B$.

A carrier block layer (for example, electronic block layer EBL) is interposed between the light emitting layer EML and the weak light releasing layer 46 or between the light emitting layer EML and the weak light releasing continuous layer HTL. Further, another carrier block layer (for example, a hole block layer HBL) is formed on the light emitting layer EML. Any carrier block layer may also be formed so as to include a plurality of light releasing sections that are separated from each other as light releasing layers and the first inspection portion that is positioned relatively to the plurality of light releasing sections and overlaps with the visual recognition electrode. Specifically, the contents of the light releasing layers 44 and 50 described above are applicable.

On top thereof, an electron transport layer ETL and an electron injection layer EIL are laminated. The electron transport layer ETL may also be formed so as to include a plurality of light releasing sections that are separated from each other as light releasing layers and the first inspection portion that is positioned relatively to the plurality of light releasing sections and overlaps with the visual recognition electrode. Specifically, the contents of the light releasing layers 44 and 50 described above are applicable.

[Common Electrode]

The display device has a common electrode 48. The common electrode 48 faces a plurality of pixel electrodes 36. The common electrode 48 is in contact with one of a plurality of layers (for example, the electron injection layer EIL). Here, since the top emission structure is adopted, the common electrode 48 is transparent. For example, an Mg layer and an Ag layer are formed as thin films that can transmit light emitted from the light emitting layer EML. If the pixel electrode 36 is an anode, the common electrode 48 is a cathode. The plurality of pixel electrodes 36, the common electrode 48, and the layer interposed therebetween constitute a light emitting element OD (see FIG. 7).

[Light Releasing Layer (Cap Layer)]

The plurality of layers overlapping with the electrode layer 38 includes a light releasing layer 50 (for example, a cap layer for improving light extraction efficiency). The plurality of light releasing sections R-CAP and G-CAP included in the light releasing layer 50 are divided into a plurality of light releasing groups $G_{R\text{-}CAP}$ and $G_{G\text{-}CAP}$ respectively corresponding to the plurality of color groups $G_R$ and $G_G$ except for one. The light releasing group $G_{R\text{-}CAP}$ includes the light releasing section R-CAP. The light releasing group $G_{G\text{-}CAP}$ includes the light releasing section G-CAP.

The light releasing layer 50 also includes a plurality of first inspection portions $50_{R\text{-}CAP}$ and $50_{G\text{-}CAP}$. The first inspection portion $50_{R\text{-}CAP}$ is positioned relatively to the light releasing section R-CAP. The first inspection portion $50_{G\text{-}CAP}$ is positioned relatively to the light releasing section G-CAP. Each of the plurality of first inspection portions $50_{R\text{-}CAP}$ and $50_{G\text{-}CAP}$ overlaps with a corresponding one of the plurality of visual recognition electrodes 40.

[Continuous Layer]

A continuous layer CAP is formed under the light releasing layer 44 (cap layer) so as to be continuous with the plurality of light releasing sections R-CAP and G-CAP. The continuous layer CAP is on the common electrode 48. The plurality of light releasing sections R-CAP and G-CAP and the continuous layer CAP are made of different materials. For example, the plurality of light releasing sections R-CAP and G-CAP are formed from an organic material, while the continuous layer CAP is formed from an inorganic material. The continuous layer CAP does not emit light by photoluminescence.

A sealing layer 52 is formed on the light releasing layer 50 and the continuous layer CAP. The sealing layer 52 uses a plurality of layers including the light emitting layer EML for preventing moisture from entering from the outside as one of the functions, and high gas barrier properties are required. The sealing layer 52 has a laminated structure of an organic film 54 and a pair of inorganic films 56 (for example, silicon nitride films) sandwiching the organic film 54. The sealing layer 52 may further be provided with an electrode for performing touch sensing or may be laminated with a resin layer or a polarizing plate (for example, a circular polarizing plate) serving as a protective film.

As shown in FIG. 5, the plurality of visual recognition electrodes 40 are positioned relatively to the plurality of pixel electrodes 36. The first inspection portion $44_{R\text{-}EML}$ is positioned relatively to the light releasing section R-EML (light emitting section) included in the light releasing group (color group $G_R$). The first inspection portion $44_{G\text{-}EML}$ is positioned relatively to the light releasing section G-EML (light emitting section) included in the light releasing group (color group $G_G$). The first inspection portion $44_{B\text{-}EML}$ is positioned relatively to the light releasing section B-EML (light emitting section) included in the light releasing group (color group $G_B$).

The first inspection portion $50_{R\text{-}CAP}$ is positioned relatively to the light releasing section R-CAP included in the light releasing group $G_{R\text{-}CAP}$. The first inspection portion $50_{G\text{-}CAP}$ is positioned relatively to the light releasing section G-CAP included in the light releasing group $G_{G\text{-}CAP}$.

The second inspection portion $46_{R\text{-}HTL}$ is positioned relatively to the weak light releasing section R-THL included in the weak light releasing group $G_{R\text{-}THL}$. The second inspection portion $46_{G\text{-}HTL}$ is positioned relatively to the weak light releasing section G-HTL included in the weak light releasing group $G_{G\text{-}THL}$.

Figure 7:
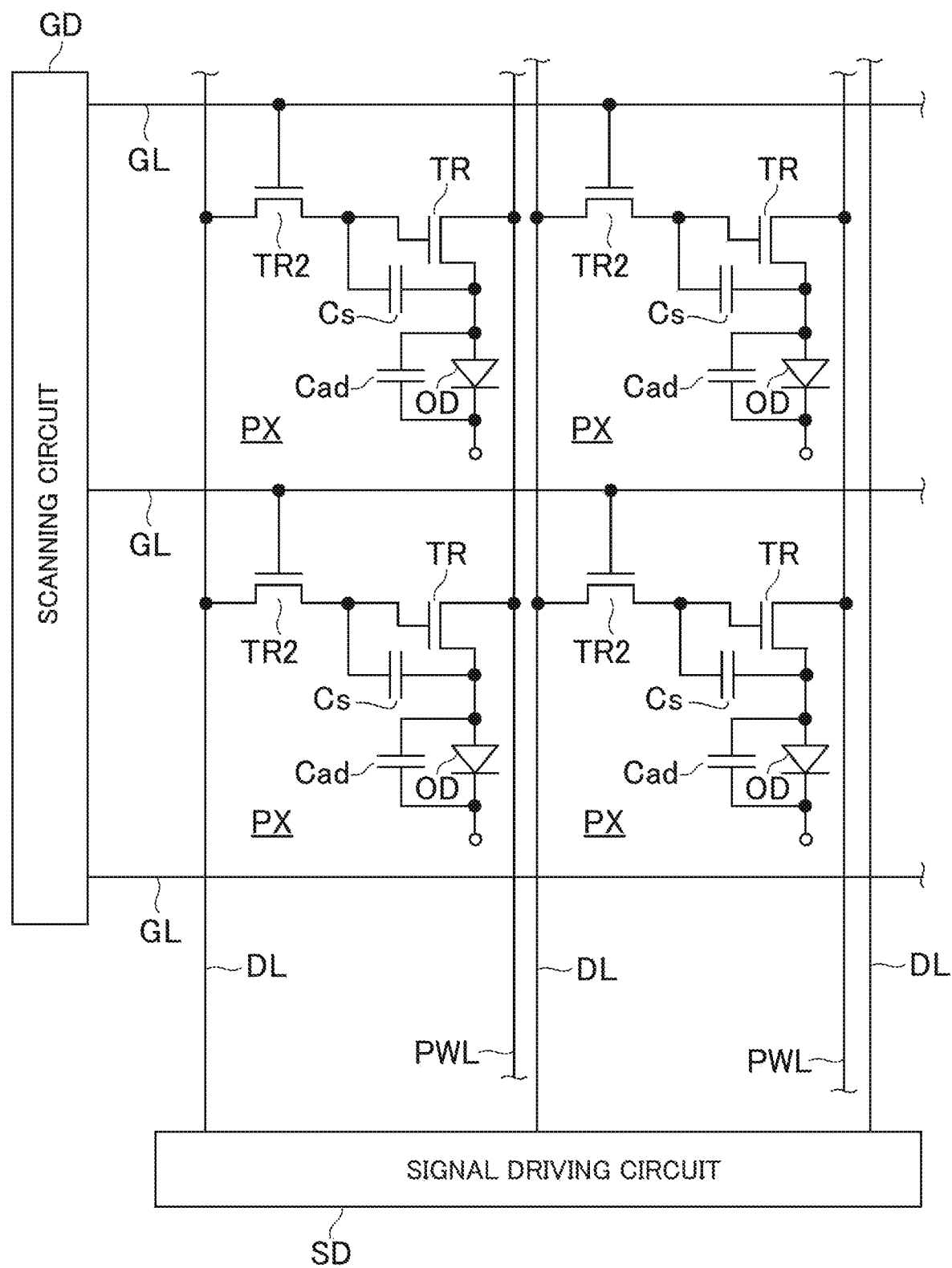
FIG. 7 is a circuit view of the display device shown in FIG. 1.

FIG. 7 is a circuit view of the display device shown in FIG. 1. The circuit includes a plurality of scanning lines GL connected to a scanning circuit GD and a plurality of signal lines DL connected to a signal driving circuit SD. The signal driving circuit SD is disposed in an integrated circuit chip CP shown in FIG. 1. A region surrounded by two adjacent scanning lines GL and two adjacent signal lines DL is one pixel PX. The pixel PX includes the thin film transistor TR as a driving transistor, a thin film transistor TR2 as a switch, and the storage capacitor Cs. When a gate voltage is applied to the scanning line GL, the thin film transistor TR2 is turned on, a video signal is supplied from the signal line DL, and charges are accumulated in the storage capacitor Cs. As charges are accumulated in the storage capacitor Cs, the thin film transistor TR is turned on, and a current flows from a power supply line PWL to the light emitting element OD. The light emitting element OD emits light by this current.

[Multi-Piece Display Panel]

Figure 8:
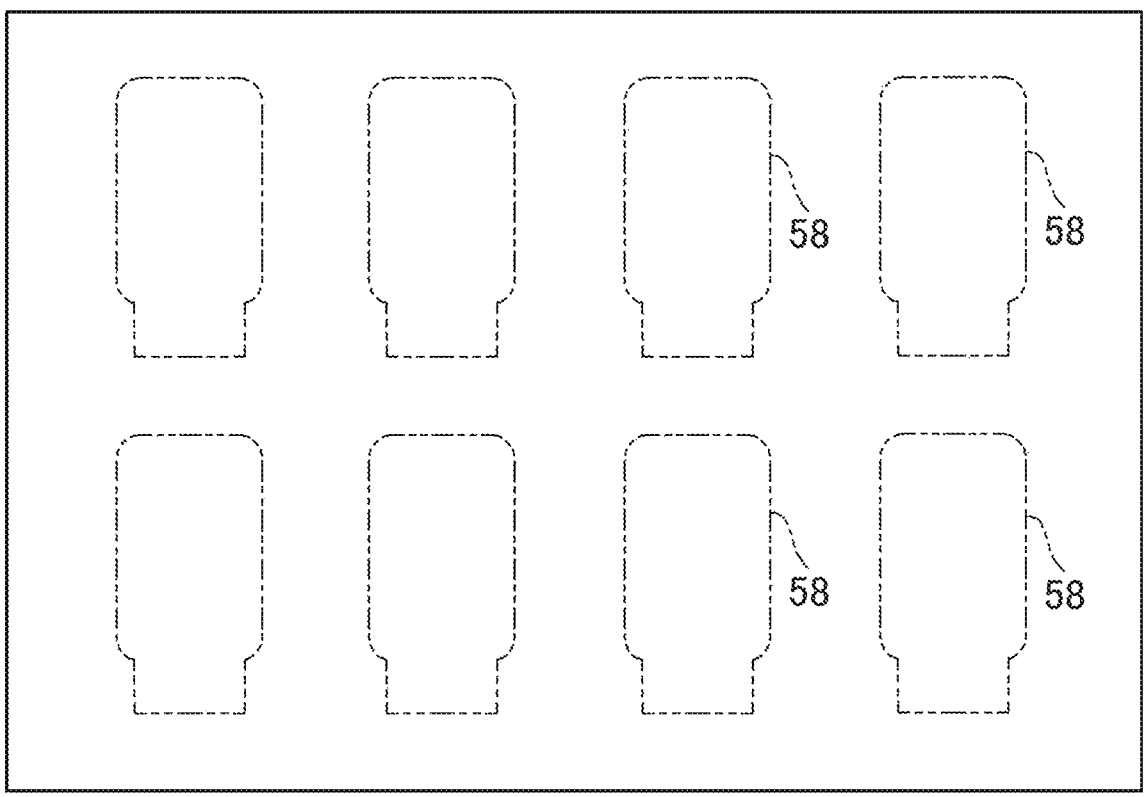
FIG. 8 is a plan view of a multi-piece display panel according to the embodiment.

FIG. 8 is a plan view of a multi-piece display panel according to the embodiment. The multi-piece display panel has a plurality of manufacturing regions 58 for manufacturing a plurality of display devices. Each of the plurality of manufacturing regions 58 has the structure of the display device described above.

[Manufacturing Method of Display Device]

Next, a manufacturing method for the display device will be described. In a manufacturing process, the electrode layer 38 is formed. As shown in FIG. 5, the electrode layer 38 includes the plurality of pixel electrodes 36 and the plurality of visual recognition electrodes 40 described above. The manufacturing includes formation of an etching mask by photolithography and etching and can be finely processed. Therefore, the plurality of pixel electrodes 36 and the plurality of visual recognition electrodes 40 can be formed at relatively accurate positions.

A plurality of layers overlapping with the electrode layer 38 are formed. Since the formation of the plurality of layers is performed by vapor deposition using a mask, there is a possibility that positional deviation occurs. The details of the plurality of layers are as described above and include the light emitting layer EML that emits light by electroluminescence. The lowermost layer HIL of the plurality of layers are in contact with the plurality of pixel electrodes 36 in the display area DA.

Figure 9A:
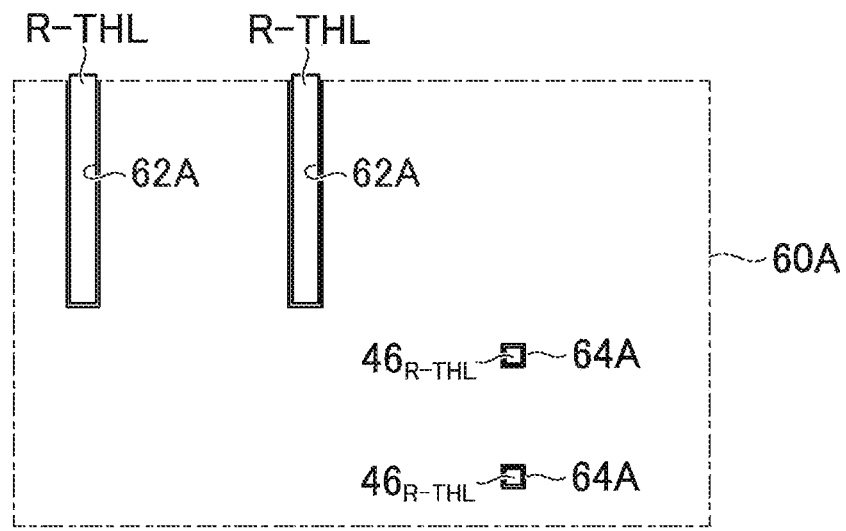
FIGS. 9A and 9B are views showing a process of forming a weak light releasing layer.
Figure 9B:
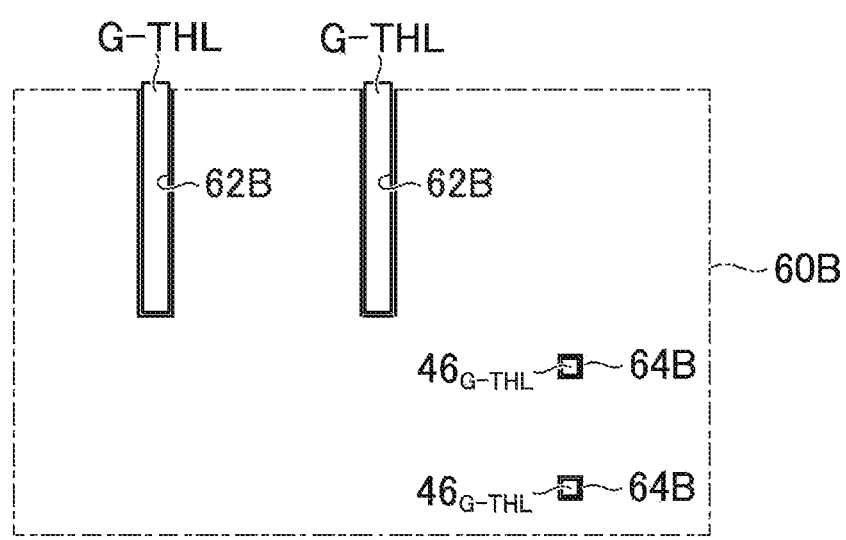

FIGS. 9A and 9B are views showing a process of forming the weak light releasing layer 46. The process includes a plurality of times of vapor deposition using a plurality of weak light releasing layer masks 60A and 60B.

The weak light releasing layer mask 60A includes a plurality of openings 62A for forming the plurality of weak light releasing sections R-THL. The weak light releasing layer mask 60A includes a plurality of openings 64A for forming the plurality of second inspection portions $46_{R\text{-}HTL}$. The plurality of weak light releasing sections R-THL and the plurality of second inspection portions $46_{R\text{-}HTL}$ are formed at relatively fixed positions by the vapor deposition.

The weak light releasing layer mask 60B includes a plurality of openings 62B for forming the plurality of weak light releasing sections G-HTL. The weak light releasing layer mask 60B includes a plurality of openings 64B for forming the plurality of second inspection portions $46_{G\text{-}HTL}$. The plurality of weak light releasing sections G-HTL and the plurality of second inspection portions $46_{G\text{-}HTL}$ are formed at relatively fixed positions by the vapor deposition.

Figure 10A:
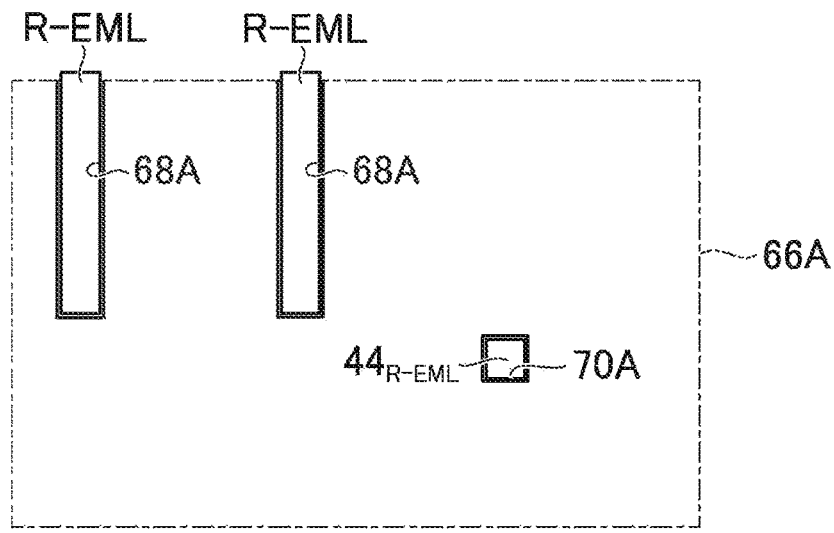
FIGS. 10A to 10C are views showing a process of forming a light releasing layer as a light emitting layer.
Figure 10B:
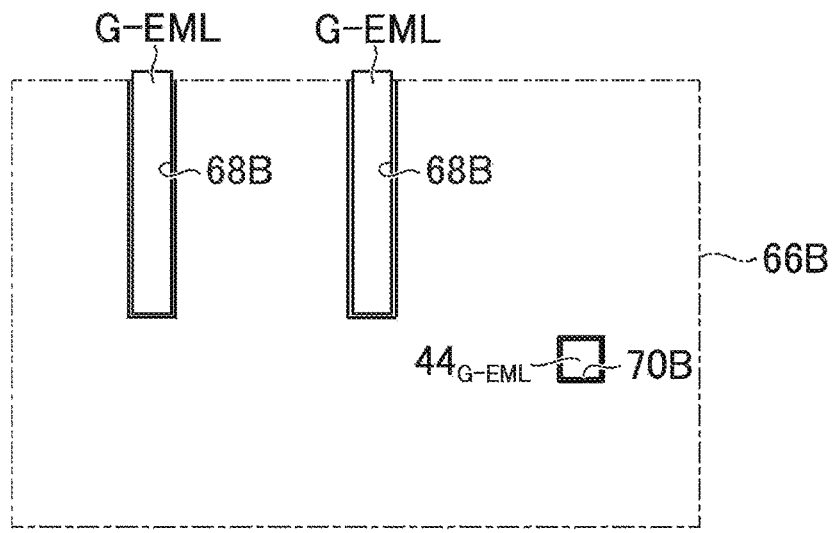
Figure 10C:
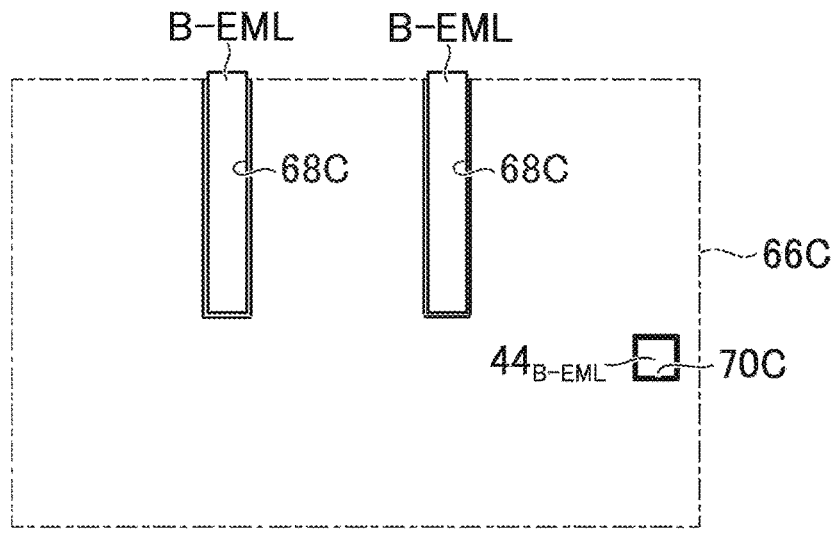

FIGS. 10A to 10C are views showing a process of forming the light releasing layer 44 as the light emitting layer EML. The process includes a plurality of times of vapor deposition using a plurality of light releasing layer masks 66A, 66B, and 66C.

The light releasing layer mask 66A includes a plurality of openings 68A for forming the plurality of light releasing sections R-EML. The light releasing layer mask 66A includes an opening 70A for forming the first inspection portion $44_{R\text{-}EML}$. The plurality of light releasing sections R-EML and the first inspection portion $44_{R\text{-}EML}$ are formed at relatively fixed positions by the vapor deposition.

The light releasing layer mask 66B includes a plurality of openings 68B for forming the plurality of light releasing sections G-EML. The light releasing layer mask 66B includes an opening 70B for forming the first inspection portion $44_{G\text{-}EML}$. The plurality of light releasing sections G-EML and the first inspection portion $44_{G\text{-}EML}$ are formed at relatively fixed positions by the vapor deposition.

The light releasing layer mask 66C includes a plurality of openings 68C for forming the plurality of light releasing sections B-EML. The light releasing layer mask 66C includes an opening 70C for forming the first inspection portion $44_{B\text{-}EML}$. The plurality of light releasing sections B-EML and the first inspection portion $44_{B\text{-}EML}$ are formed at relatively fixed positions by vapor deposition.

It is preferable that each of the plurality of first inspection portions $44_{R\text{-}EML}$, $44_{G\text{-}EML}$, and $44_{B\text{-}EML}$ is formed so as to surround the entire corresponding one of the plurality of second inspection portions $46_{R\text{-}HTL}$ and $46_{G\text{-}HTL}$. For this purpose, it is preferable to design the second inspection portions $46_{R\text{-}HTL}$ and $46_{G\text{-}HTL}$ sufficiently smaller than the first inspection portions $44_{R\text{-}EML}$, $44_{G\text{-}EML}$, and $44_{B\text{-}EML}$ in consideration of manufacturing errors.

Subsequently, the common electrode 48 shown in FIG. 6 is formed. The common electrode 48 is formed so as to face the plurality of pixel electrodes 36 and to be in contact with one of the plurality of layers (for example, the electron injection layer EIL).

Figure 11A:
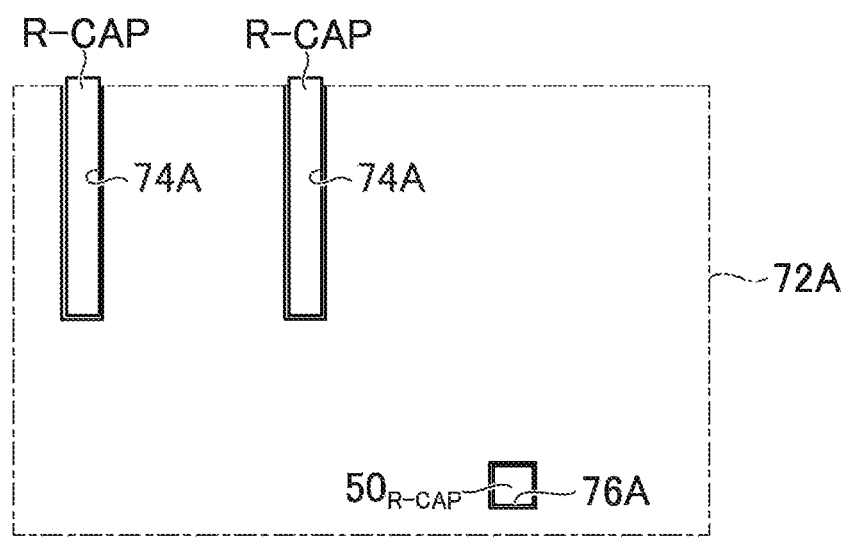
FIGS. 11A and 11B are views showing a process of forming a light releasing layer as a cap layer.
Figure 11B:
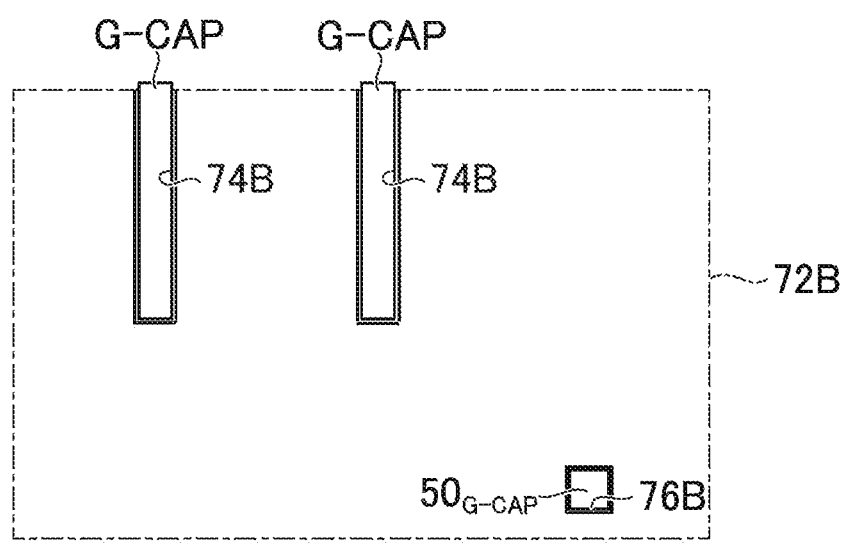

FIGS. 11A and 11B are views showing a process of forming the light releasing layer 44 as a cap layer. The process includes a plurality of times of vapor deposition using a plurality of light releasing layer masks 72A and 72B.

The light releasing layer mask 72A includes a plurality of openings 74A for forming the plurality of light releasing sections R-CAP. The light releasing layer mask 72A includes an opening 76A for forming the first inspection portion $50_{R\text{-}CAP}$. The plurality of light releasing sections R-CAP and the first inspection portion $50_{R\text{-}CAP}$ are formed at relatively fixed positions by vapor deposition.

The light releasing layer mask 72B includes a plurality of openings 74B for forming the plurality of light releasing sections G-CAP. The light releasing layer mask 72B includes an opening 76B for forming the first inspection portion $50_{G\text{-}CAP}$. The plurality of light releasing sections G-CAP and the first inspection portion $50_{G\text{-}CAP}$ are formed at relatively fixed positions by vapor deposition.

In the above-described process, the plurality of weak light releasing sections R-THL and G-HTL are formed so as to overlap with the plurality of pixel electrodes 36, respectively, but the positions thereof may be deviated depending on the positions of the weak light releasing layer masks 60A and 60B. Similarly, the plurality of light releasing sections R-EML, G-EML, B-EML, R-CAP, and G-CAP are formed so as to overlap with the plurality of weak light releasing sections R-THL and G-HTL, respectively. But the positions thereof may be deviated depending on the positions of the light releasing layer masks 66A, 66B, 66C, 72A, and 72B. Therefore, the positional deviation inspections thereof are performed by using the first inspection portions $44_{R\text{-}EML}$, $44_{G\text{-}EML}$, $44_{B\text{-}EML}$, $50_{R\text{-}CAP}$, and $50_{G\text{-}CAP}$, and the second inspection portions $46_{R\text{-}HTL}$ and $46_{G\text{-}HTL}$.

Figure 12:
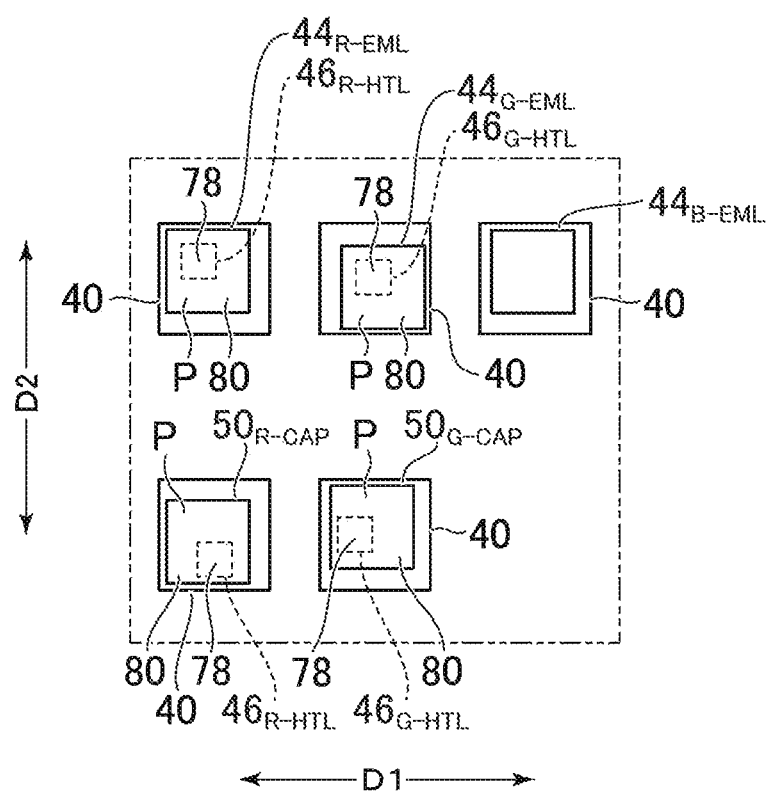
FIG. 12 is a view showing positional deviation inspection.

FIG. 12 is a view showing the positional deviation inspection. In the positional deviation inspection, the visual recognition electrode 40 is recognized by the reflected light. The reflected light is visible light, and light from a halogen lamp can be used.

The first inspection portions $44_{R\text{-}EML}$, $44_{G\text{-}EML}$, $44_{B\text{-}EML}$, $50_{R\text{-}CAP}$, and $50_{G\text{-}CAP}$ and the second inspection portions $46_{R\text{-}HTL}$ and $46_{G\text{-}HTL}$ are recognized. The recognition is performed collectively by using light emission by photoluminescence. Specifically, these portions are irradiated with ultraviolet rays to emit light. Such recognition includes imaging by a plurality of color image sensors respectively corresponding to a plurality of light emitting colors.

[First and Second Regions]

There are a first region 78 and a second region 80 inside the outer shape of each of the first inspection portions $44_{R\text{-}EML}$, $44_{G\text{-}EML}$, $50_{R\text{-}CAP}$, and $50_{G\text{-}CAP}$. The first region 78 and the second region 80 differ depending on whether or not there is an overlap with corresponding one of the second inspection portions $46_{R\text{-}HTL}$ and $46_{G\text{-}HTL}$.

For example, the first region 78 is a region where the second inspection portion $46_{R\text{-}HTL}$ overlaps with the first inspection portion $44_{R\text{-}EML}$. The second region 80 is a region where the second inspection portion $46_{R\text{-}HTL}$ does not overlap with the first inspection portion $44_{R\text{-}EML}$. The first region 78 is a region where the second inspection portion $46_{G\text{-}HTL}$ overlaps with the first inspection portion $44_{G\text{-}EML}$. The second region 80 is a region where the second inspection portion $46_{G\text{-}HTL}$ does not overlap with the first inspection portion $44_{G\text{-}EML}$. The first region 78 is a region where the second inspection portion $46_{R\text{-}HTL}$ overlaps with the first inspection portion $50_{R\text{-}CAP}$. The second region 80 is a region where the second inspection portion $46_{R\text{-}HTL}$ does not overlap with the first inspection portion $50_{R\text{-}CAP}$. The first region 78 is a region where the second inspection portion $46_{G\text{-}HTL}$ overlaps with the first inspection portion $50_{G\text{-}CAP}$. The second region 80 is a region where the second inspection portion $46_{G\text{-}HTL}$ does not overlap with the first inspection portion $50_{G\text{-}CAP}$.

The first region 78 is sandwiched between any pair of portions P of the second region 80 in any of a plurality of directions D1 and D2 orthogonal to each other. Therefore, it is easy to recognize the shapes of the first region 78 and the second region 80. Therefore, it is easy to recognize the shapes of the first inspection portions $44_{R\text{-}EML}$, $44_{G\text{-}EML}$, $50_{R\text{-}CAP}$, and $50_{G\text{-}CAP}$ and the second inspection portions $46_{R\text{-}HTL}$ and $46_{G\text{-}HTL}$. Depending on the relative position of the visual recognition electrode 40 with respect to the first inspection portions $44_{R\text{-}EML}$, $44_{G\text{-}EML}$, $50_{R\text{-}CAP}$, and $50_{G\text{-}CAP}$ and the second inspection portions $46_{R\text{-}HTL}$ and $46_{G\text{-}HTL}$, the positional deviation between the light releasing layer 44 and the weak light releasing layer 46 is determined.

According to the present embodiment, it is possible to perform positional deviation inspection with high accuracy with the first region 78 and the second region 80 having different degrees of light emission by photoluminescence. Thereafter, the multi-piece display panel having a plurality of product regions is cut (for example, trimmed). Cutting can be performed with a laser.

EXAMPLE

A region where the first inspection portion and the second inspection portion overlap has higher light emission by photoluminescence than a non-overlapping region. This was found from the following experimental results.

TABLE 1

|   |   | Luminance for colors by image sensor | | |
|---|---|---|---|---|
|   |   | R | G | B |
| Visual recognition electrodes | | 100% | 100% | 100% |
| A | First inspection portion (R-EML) | 476% | 171% | 135% |
|   | Second inspection portion (R-HTL) | 112% | 106% | 112% |
|   | First inspection portion + Second inspection portion | 776% | 247% | 247% |
| B | First inspection portion (R-CAP) | 147% | 518% | 1135% |
|   | Second inspection portion (R-HTL) | 100% | 106% | 100% |
|   | First inspection portion + Second inspection portion | 141% | 641% | 1429% |

In the experiment, the visual recognition electrode 40 has a laminated structure of titanium, aluminum, and titanium. The visual recognition electrode 40 was irradiated with visible light, and the luminance of the reflected light was measured with an image sensor for each color of red (R), green (G), and blue (B). It is assumed that the luminance is 100%.

In a condition A, the first inspection portion was formed from the same material as the light releasing section R-EML, and the second inspection portion was formed from the same material as the weak light releasing section R-THL. When the luminance was measured by being irradiated with ultraviolet rays and emitting light by photoluminescence, the luminance of red (R) was 776% in the overlapped first inspection portion and second inspection portion. This value is larger than 476%, which is the luminance of the first inspection portion. The luminance of the second inspection portion was 112%.

In a condition B, the first inspection portion was formed from the same material as the light releasing section R-CAP, and the second inspection portion was formed from the same material as the weak releasing section R-THL. When the luminance was measured by being irradiated with ultraviolet rays and emitting light by photoluminescence, the luminance of blue (B) was 1429% in the overlapped first inspection portion and second inspection portion. This value is larger than 1135%, which is the luminance of the first inspection portion. The luminance of the second inspection portion was 100%.

From the experimental results, it was found that when the first inspection portion and the second inspection portion are laminated, light emission by photoluminescence is enhanced. As a reason therefor, it is conceivable that the light extraction efficiency is increased in front of the light releasing layers 44 and 50 due to a change in interface reflectance and the like due to the lamination of the weak light releasing layer 46. Alternatively, it is conceivable that a part of the electrons photoexcited in the weak light releasing layer 46 moved to the light releasing layers 44 and 50, and the amount of electron transition contributing to light emission increased.

Modification Example 1

Figure 13:
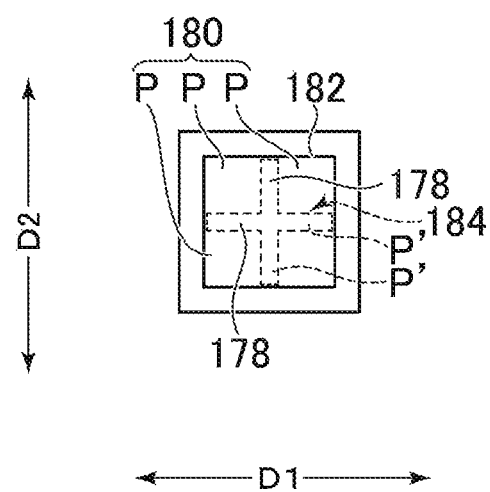
FIG. 13 is a plan view of a first inspection portion and a second inspection portion according to Modification Example 1.

FIG. 13 is a plan view of a first inspection portion and a second inspection portion according to Modification Example 1. The planar shape of a second inspection portion 184 has a portion P' extending along a plurality of directions D1 and D2 intersecting each other. In the example shown in FIG. 13, the planar shape of the second inspection portion 184 is a cross shape but may be a triangle, a Y shape, or a star shape. A first region 178 is a region where the second inspection portion 184 overlaps with a first inspection portion 182 (for example, a cross shape). A second region 180 is a region where the second inspection portion 184 does not overlap with the first inspection portion 182. The first region 178 is sandwiched between any pair of portions P of the second region 180 in any of the plurality of directions D1 and D2 orthogonal to each other.

Modification Example 2

Figure 14:
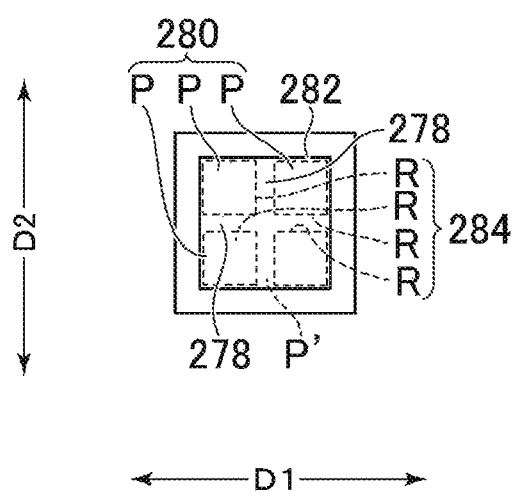
FIG. 14 is a plan view of a first inspection portion and a second inspection portion according to Modification Example 2.

FIG. 14 is a plan view of a first inspection portion and a second inspection portion according to Modification Example 2. The planar shape of a second inspection portion 284 includes a plurality of regions R in which one shape is cut out by the portion P' (for example, a cross shape) extending along a plurality of directions D1 and D2 intersecting each other. The region R is rectangular. The plurality of regions R are disposed so that each one corner faces each other. A first region 278 is a region where the second inspection portion 284 does not overlap with a first inspection portion 282 (for example, a cross shape). A second region 280 is a region where the second inspection portion 284 overlaps with the first inspection portion 282. The first region 278 is sandwiched between any pair of portions P (a pair of regions R) of the second region 280 in any of a plurality of directions D1 and D2 orthogonal to each other.

Modification Example 3

Figure 15:
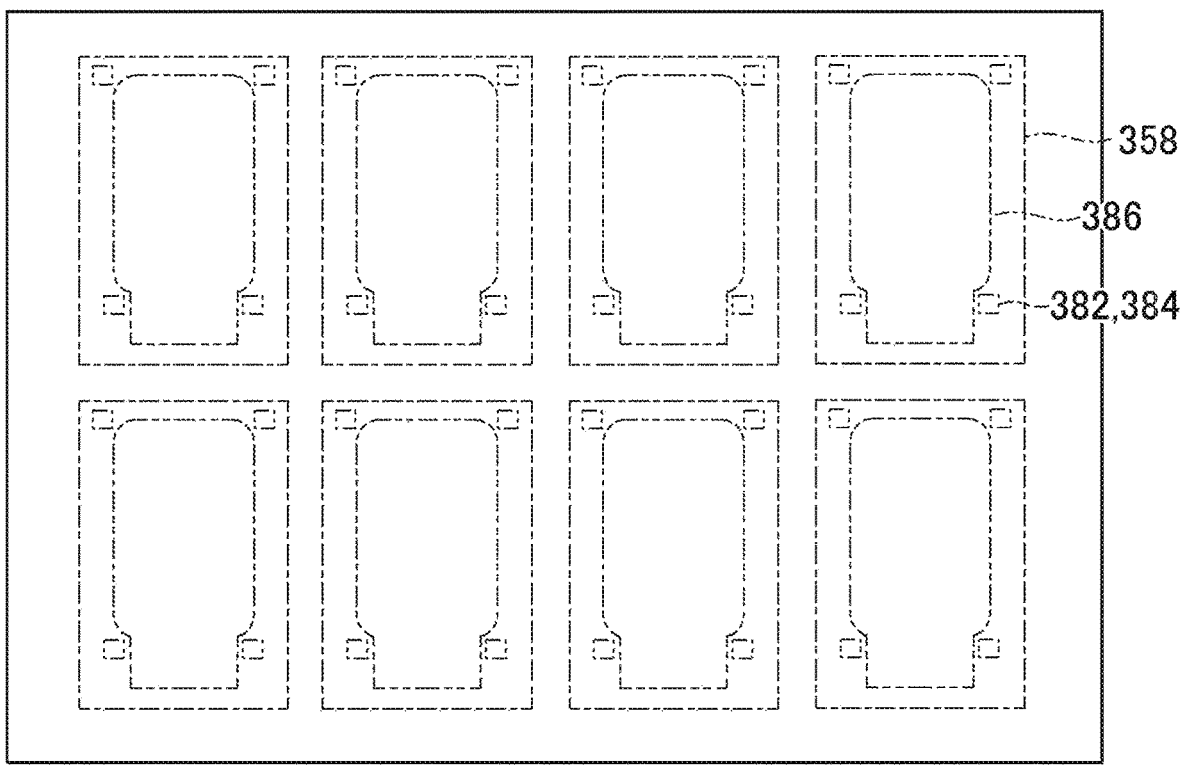
FIG. 15 is a plan view of a multi-piece display panel according to Modification Example 3.

FIG. 15 is a plan view of a multi-piece display panel according to Modification Example 3. A first inspection portion 382 and a second inspection portion 384 are outside each of a plurality of product areas 386 cut out by the plurality of display devices. That is, the multi-piece display panel has a manufacturing area 358 for manufacturing a display device outside the product area 386.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
    an electrode layer that includes a plurality of pixel electrodes arranged in a display area, and a visual recognition electrode positioned relatively to the plurality of pixel electrodes outside the display area;
    a plurality of layers that include a light emitting layer overlapping with the electrode layer and emitting light by electroluminescence, a lowermost layer being in contact with the plurality of pixel electrodes in the display area; and
    a common electrode that faces the plurality of pixel electrodes and is in contact with any of the plurality of layers,
    wherein the plurality of layers include a light releasing layer that emits light by photoluminescence, and a weak light releasing layer that emits less light by the photoluminescence than the light releasing layer,
    at least the light emitting layer is the light releasing layer,
    the light releasing layer includes a plurality of light releasing sections that are separated from each other, and a first inspection portion that is positioned relatively to the plurality of light releasing sections and overlaps with the visual recognition electrode,
    the weak light releasing layer includes a plurality of weak light releasing sections separated from each other by overlapping with corresponding one of the plurality of light releasing sections and a second inspection portion that is positioned relatively to the plurality of weak light releasing sections and overlaps with the first inspection portion,
    there are a first region and a second region that differ depending on whether or not there is an overlap with the second inspection portion inside an outer shape of the first inspection portion, and
    the first region is sandwiched between any pair of portions of the second region in any of a plurality of directions orthogonal to each other.

2. The display device according to claim 1,
    wherein the light emitting layer includes a plurality of light emitting sections as the plurality of light releasing sections, and the plurality of light emitting sections are divided into a plurality of color groups according to a plurality of light emitting colors, and each of the plurality of color groups includes a group of light emitting sections,
    the visual recognition electrode includes a plurality of visual recognition electrodes, and
    the first inspection portion included in the light releasing layer that is the light emitting layer includes a plurality of first inspection portions, and each of the plurality of first inspection portions is positioned relatively to the group of light emitting sections included in corresponding one of the plurality of color groups and overlaps with corresponding one of the plurality of visual recognition electrodes.

3. The display device according to claim 2,
    wherein the plurality of weak light releasing sections are divided into a plurality of weak light releasing groups respectively corresponding to the plurality of color groups except for one, and each of the plurality of weak light releasing groups includes a group of weak light releasing sections, and the second inspection portion includes a plurality of second inspection portions, and each of the plurality of second inspection portions is positioned relatively to the group of weak light releasing sections included in corresponding one of the plurality of weak light releasing groups and overlaps with corresponding one of the plurality of first inspection portions.

4. The display device according to claim 3,
wherein the plurality of layers include a weak light releasing continuous layer in continuous contact with the plurality of weak light releasing sections, and
the weak light releasing continuous layer and the plurality of weak light releasing sections are formed of the same material.

5. The display device according to claim 2,
wherein the plurality of layers include the light releasing layer in addition to the light emitting layer,
the plurality of light releasing sections included in the light releasing layer other than the light emitting layer are divided into a plurality of light releasing groups respectively corresponding to the plurality of color groups except for one, and each of the plurality of light releasing groups includes a group of light releasing sections, and
the first inspection portion included in the light releasing layer other than the light emitting layer includes a plurality of first inspection portions, and each of the plurality of first inspection portions is positioned relatively to the group of light releasing sections included in corresponding one of the plurality of light releasing groups and overlaps with corresponding one of the plurality of visual recognition electrodes.

6. The display device according to claim 5,
wherein the plurality of layers include a continuous layer that is in continuous contact with the plurality of light releasing sections included in the light releasing layer excluding the light emitting layer.

7. The display device according to claim 5,
wherein the light releasing layer other than the light emitting layer is a cap layer for improving light extraction efficiency.

8. The display device according to claim 1,
wherein the weak light releasing layer is a carrier transport layer for transporting charges.

9. The display device according to claim 1,
wherein the first inspection portion and the second inspection portion are similar in a planar shape.

10. The display device according to claim 1,
wherein the planar shape of the second inspection portion has a portion extending along a plurality of directions intersecting each other.

11. The display device according to claim 1,
wherein the planar shape of the second inspection portion is composed of a plurality of regions in which one shape is cut out by portions extending along a plurality of directions intersecting each other.

12. The display device according to claim 1,
wherein the first region is a region where the second inspection portion overlaps with the first inspection portion, and
the second region is a region where the second inspection portion does not overlap with the first inspection portion.

13. The display device according to claim 1,
wherein the first region is a region where the second inspection portion does not overlap with the first inspection portion, and
the second region is a region where the second inspection portion overlaps the first inspection portion.

14. A multi-piece display panel having a plurality of manufacturing areas for manufacturing a plurality of display devices,
wherein each of the plurality of manufacturing areas includes:
an electrode layer that includes a plurality of pixel electrodes arranged in a display area, and a visual recognition electrode positioned relatively to the plurality of pixel electrodes outside the display area,
a plurality of layers that include a light emitting layer overlapping with the electrode layer and emitting light by electroluminescence, a lowermost layer being in contact with the plurality of pixel electrodes in the display area, and
a common electrode that faces the plurality of pixel electrodes and is in contact with any of the plurality of layers,
wherein the plurality of layers include a light releasing layer that emits light by photoluminescence, and a weak light releasing layer that emits less light by the photoluminescence than the light releasing layer,
at least the light emitting layer is the light releasing layer,
the light releasing layer includes a plurality of light releasing sections that are separated from each other, and a first inspection portion that is positioned relatively to the plurality of light releasing sections and overlaps with the visual recognition electrode,
the weak light releasing layer includes a plurality of weak light releasing sections separated from each other by overlapping with corresponding one of the plurality of light releasing sections and a second inspection portion that is positioned relatively to the plurality of weak light releasing sections and overlaps with the first inspection portion,
there are a first region and a second region that differ depending on whether or not there is an overlap with the second inspection portion inside an outer shape of the first inspection portion, and
the first region is sandwiched between any pair of portions of the second region in any of a plurality of directions orthogonal to each other.

15. A manufacturing method for a display device, the method comprising:
forming an electrode layer so as to include a plurality of pixel electrodes arranged in a display area, and a visual recognition electrode positioned relatively to the plurality of pixel electrodes outside the display area;
forming a plurality of layers so as to include a light emitting layer overlapping with the electrode layer and emitting light by electroluminescence, a lowermost layer being in contact with the plurality of pixel electrodes in the display area;
forming a common electrode so as to face the plurality of pixel electrodes and to be in contact with any one of the plurality of layers; and
positional deviation inspection,
wherein the plurality of layers include a light releasing layer that emits light by photoluminescence, and a weak light releasing layer that emits less light by the photoluminescence than the light releasing layer,
at least the light emitting layer is the light releasing layer, the light releasing layer includes a plurality of light releasing sections that are separated from each other, and a first inspection portion that is positioned relatively to the plurality of light releasing sections and overlaps with the visual recognition electrode, the weak light releasing layer includes a plurality of weak light releasing sections separated from each other by overlapping with corresponding one of the plurality of light releasing sections and a second inspection portion that is positioned relatively to the plurality of weak light releasing sections and overlaps with the first inspection portion, there are a first region and a second region that differ depending on whether or not there is an overlap with the second inspection portion inside an outer shape of the first inspection portion, the first region is sandwiched between any pair of portions of the second region in any of a plurality of directions orthogonal to each other, and the positional deviation inspection includes:
    recognizing the visual recognition electrode by reflected light,
    recognizing the first inspection portion and the second inspection portion by an intensity of light emission by the photoluminescence being different in the first region and the second region, and
    determining a positional deviation of the light releasing layer and the weak light releasing layer according to a relative position of the visual electrode and the first inspection portion and the second inspection portion.

16. The manufacturing method for a display device according to claim 15,
wherein a region where the first inspection portion and the second inspection portion overlap has higher light emission by the photoluminescence than a non-overlapping region.

17. The manufacturing method for a display device according to claim 15,
wherein the light emitting layer includes a plurality of light emitting sections as the plurality of light releasing sections, and the plurality of light emitting sections are divided into a plurality of color groups according to a plurality of light emitting colors, and each of the plurality of color groups includes a group of light emitting sections, and
recognition of the first inspection portion and the second inspection portion includes imaging by a plurality of color image sensors respectively corresponding to the plurality of light emitting colors.

18. The manufacturing method for a display device according to claim 15, the method further comprising:
cutting a multi-piece display panel having a plurality of product areas,
wherein the first inspection portion and the second inspection portion are outside each of the plurality of product areas.

19. The manufacturing method for a display device according to claim 15,
wherein the visual recognition electrode includes a plurality of visual recognition electrodes,
the first inspection portion includes a plurality of first inspection portions,
the second inspection portion includes a plurality of second inspection portions,
forming the light emitting layer as the light emitting layer includes a plurality of times of vapor deposition using a plurality of light releasing layer masks, and
each of the plurality of light releasing layer masks includes a plurality of openings for forming a corresponding group of the plurality of light releasing sections and an opening for forming corresponding one of the plurality of first inspection portions.

20. The manufacturing method for a display device according to claim 19,
wherein forming the weak light releasing layer includes a plurality of times of vapor deposition using a plurality of weak light releasing layer masks, and
each of the plurality of weak light releasing layer masks includes a plurality of openings for forming a corresponding group of the plurality of weak light releasing sections and an opening for forming corresponding one of the plurality of second inspection portions.

\* \* \* \* \*